(12) United States Patent
Iwatsu et al.

(10) Patent No.: US 9,318,548 B2
(45) Date of Patent: Apr. 19, 2016

(54) SEMICONDUCTOR DEVICE

(71) Applicant: Kabushiki Kaisha Toshiba, Minato-ku, Tokyo (JP)

(72) Inventors: Yasunori Iwatsu, Chigasaki Kanagawa (JP); Masahiro Inohara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/644,128

(22) Filed: Mar. 10, 2015

(65) Prior Publication Data

US 2016/0079348 A1    Mar. 17, 2016

(30) Foreign Application Priority Data

Sep. 12, 2014 (JP) .................. 2014-187114

(51) Int. Cl.

| H01L 29/74 | (2006.01) |
| H01L 29/06 | (2006.01) |
| H01L 29/739 | (2006.01) |
| H01L 29/10 | (2006.01) |
| H01L 29/423 | (2006.01) |

(52) U.S. Cl.
CPC ........ H01L 29/0623 (2013.01); H01L 29/1095 (2013.01); H01L 29/42324 (2013.01); H01L 29/7393 (2013.01)

(58) Field of Classification Search
USPC ........................................ 257/141
See application file for complete search history.

(56) References Cited

U.S. PATENT DOCUMENTS

| 4,723,081 | A | * | 2/1988 | Akatsuka | 327/546 |
| 5,317,174 | A | * | 5/1994 | Hynecek | 257/222 |
| 5,471,075 | A | * | 11/1995 | Shekar et al. | 257/139 |
| 5,483,087 | A | * | 1/1996 | Ajit | 257/120 |
| 5,493,134 | A | * | 2/1996 | Mehrotra et al. | 257/132 |
| 5,856,218 | A | * | 1/1999 | Kinoshita et al. | 438/202 |
| 6,075,265 | A | * | 6/2000 | Goebel et al. | 257/296 |
| 8,476,684 | B2 | | 7/2013 | Coyne et al. | |
| 2002/0017703 | A1 | * | 2/2002 | Kim et al. | 257/587 |
| 2006/0220134 | A1 | * | 10/2006 | Huo et al. | 257/351 |

FOREIGN PATENT DOCUMENTS

| JP | H10-027859 | 1/1998 |
| JP | H11-135782 | 5/1999 |

* cited by examiner

Primary Examiner — Thao P Le
(74) Attorney, Agent, or Firm — White & Case LLP

(57) ABSTRACT

A semiconductor device includes a semiconductor substrate, a semiconductor layer, a first electrode, and a first insulating film. The semiconductor layer is provided on the semiconductor substrate. The semiconductor layer includes first-fifth regions. The first region includes a first portion and a second portion arranged with the first portion. The second region is provided in a surface of the first portion. The third region is provided between the second portion and the second region in the surface of the first portion. The fourth region is provided between the second portion and the third region in the surface of the first portion. The fifth region is provided in a surface of the fourth region. The first electrode is provided between the fifth region and the second portion on the semiconductor layer. The first insulating film is provided between the semiconductor layer and the first electrode.

20 Claims, 10 Drawing Sheets

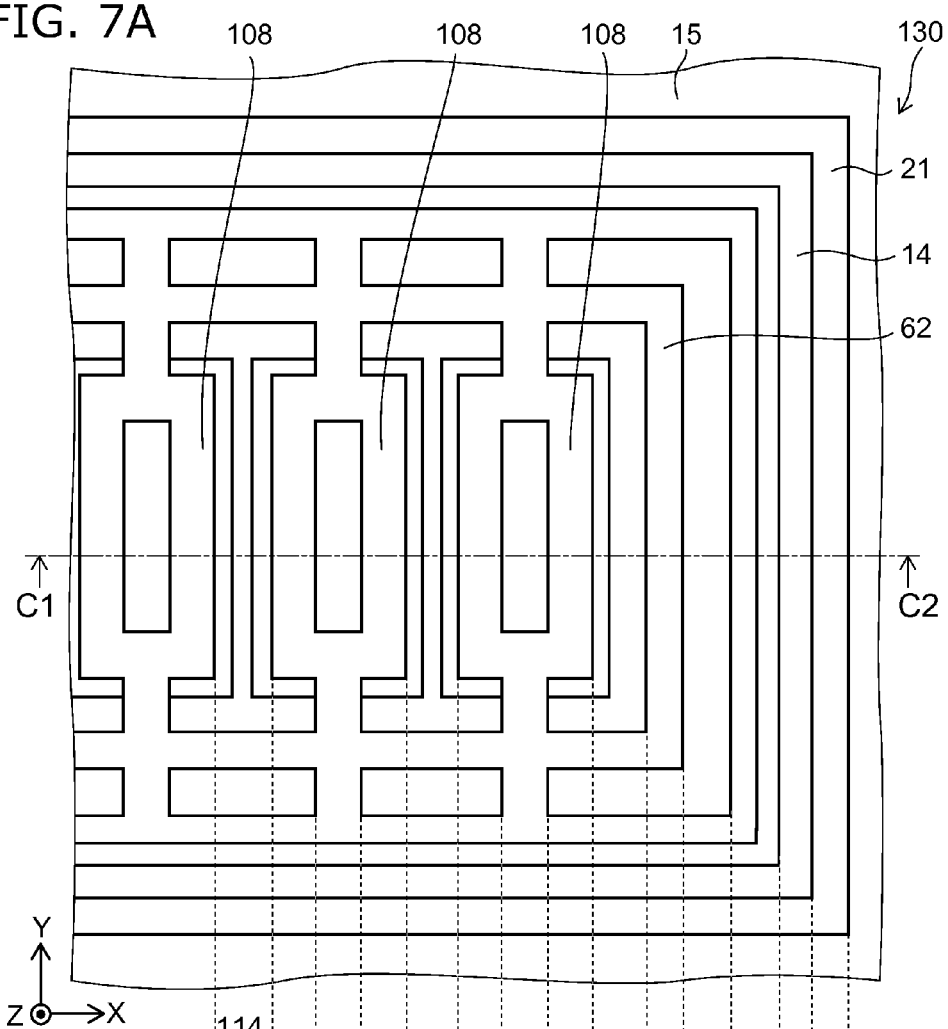
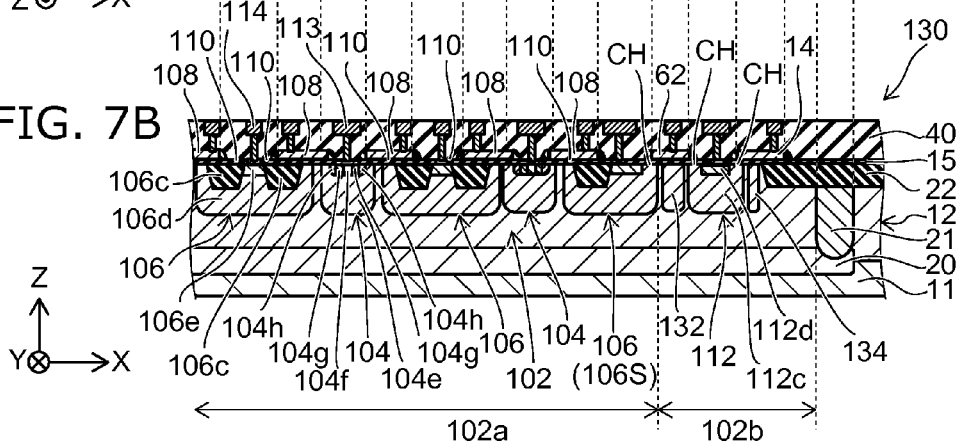

US 9,318,548 B2

SEMICONDUCTOR DEVICE

CROSS-REFERENCE TO RELATED APPLICATIONS

This application is based upon and claims the benefit of priority from Japanese Patent Application No. 2014-187114, filed on Sep. 12, 2014; the entire contents of which are incorporated herein by reference.

FIELD

Embodiments described herein relate generally to a semiconductor device.

BACKGROUND

In a semiconductor device, part of the current flowing in the device section may leak to the outside of the device section. The current like this is referred to as e.g. leakage current. The leakage current causes increased power consumption of the semiconductor device. Furthermore, in the case where a plurality of device sections are provided on a semiconductor substrate, the leakage current may flow into another adjacent device section. This causes malfunctions of the other device section or noise in the signal flowing in the other device section. Thus, suppression of leakage current is desired in the semiconductor device.

BRIEF DESCRIPTION OF THE DRAWINGS

FIGS. 7A and 7B are schematic views showing a variation of the second embodiment;

DETAILED DESCRIPTION

Figure 1A:
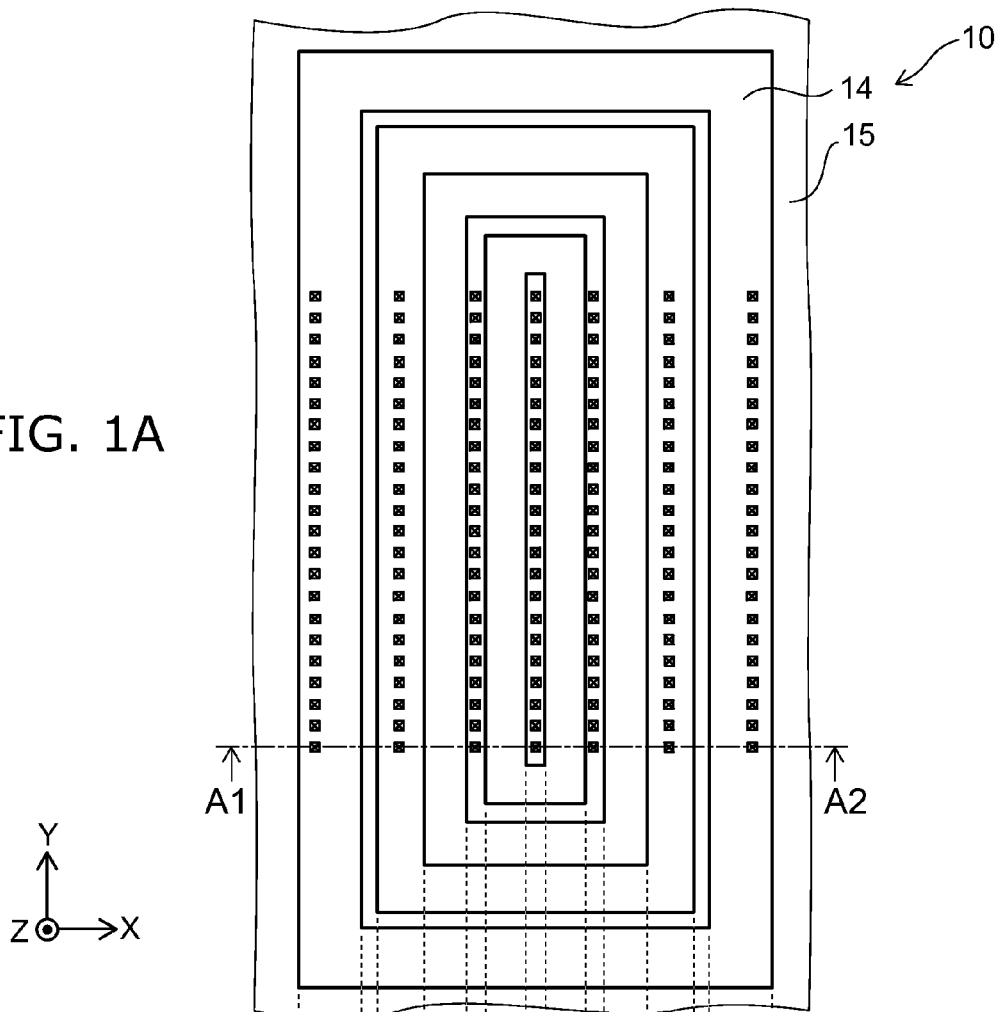
FIGS. 1A and 1B are schematic views showing part of a semiconductor device according to a first embodiment.

According to one embodiment, a semiconductor device includes a semiconductor substrate, a semiconductor layer, a first electrode, and a first insulating film. The semiconductor layer is provided on the semiconductor substrate. The semiconductor layer includes a first region, a second region, a third region, a fourth region, and a fifth region. The first region includes a first portion and a second portion. The second portion is arranged with the first portion in a first direction perpendicular to a stacking direction of the semiconductor substrate and the semiconductor layer. The second region is provided in a surface of the first portion. The second region has a first conductivity type. The third region is provided between the second portion and the second region in the surface of the first portion. The third region is apart from the second portion and the second region. The third region has a second conductivity type different from the first conductivity type. The fourth region is provided between the second portion and the third region in the surface of the first portion. The fourth region is adjacent to the second portion. The fourth region has the first conductivity type. The fifth region is provided in a surface of the fourth region. The fifth region has the second conductivity type. The first electrode is provided between the fifth region and the second portion on the semiconductor layer. The first insulating film is provided between the semiconductor layer and the first electrode.

According to another embodiment, a semiconductor device includes a semiconductor substrate, a semiconductor layer, a control electrode, a control insulating film, a first electrode, and a first insulating film. The semiconductor layer is provided on the semiconductor substrate. The semiconductor layer includes a first region, a second region, a third region, a source region, a drain region, and an insulating part. The first region includes a first portion and a second portion. The second portion is arranged with the first portion in a first direction perpendicular to a stacking direction of the semiconductor substrate and the semiconductor layer. The second region is provided in a surface of the first portion. The second region has a first conductivity type. The third region is provided between the second portion and the second region in the surface of the first portion. The third region is adjacent to the second portion. The third region has a second conductivity type different from the first conductivity type. The source region is provided in a surface of the second region. The source region has the second conductivity type. The drain region is provided in a surface of the third region. The drain region has the second conductivity type. The insulating part is provided between the source region and the drain region in the surface of the third region. The insulating part is adjacent to the drain region. The control electrode is formed astride between the source region and the insulating part on the semiconductor layer. The control insulating film is provided between the control electrode and the semiconductor layer. The first electrode is provided between the drain region and the second portion on the semiconductor layer. The first insulating film is provided between the semiconductor layer and the first electrode.

According to another embodiment, a semiconductor device includes a semiconductor substrate, a first region, a second region, a third region, a control insulating film, a control electrode, a first insulating film, and a first electrode. The first region is provided on the semiconductor substrate. The first region includes a first portion and a second portion. The second portion is arranged with the first portion in a first direction perpendicular to a stacking direction of the semiconductor substrate and the first region. The first region has a first conductivity type. The second region is provided in a surface of the first portion. The second region has a second conductivity type different from the first conductivity type. The third region is provided between the second portion and the second region in the surface of the first portion. The third region is apart from the second region. The third region is adjacent to the second portion. The third region has the second conductivity type. The control insulating film is provided on the first portion. The control insulating film is placed between the second region and the third region. The control electrode is provided on the control insulating film. The first insulating film is provided on the second portion. The first insulating film is adjacent to the third region. The first electrode is provided astride between the third region and the first insulating film on the second portion.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

First Embodiment

Figure 1B:
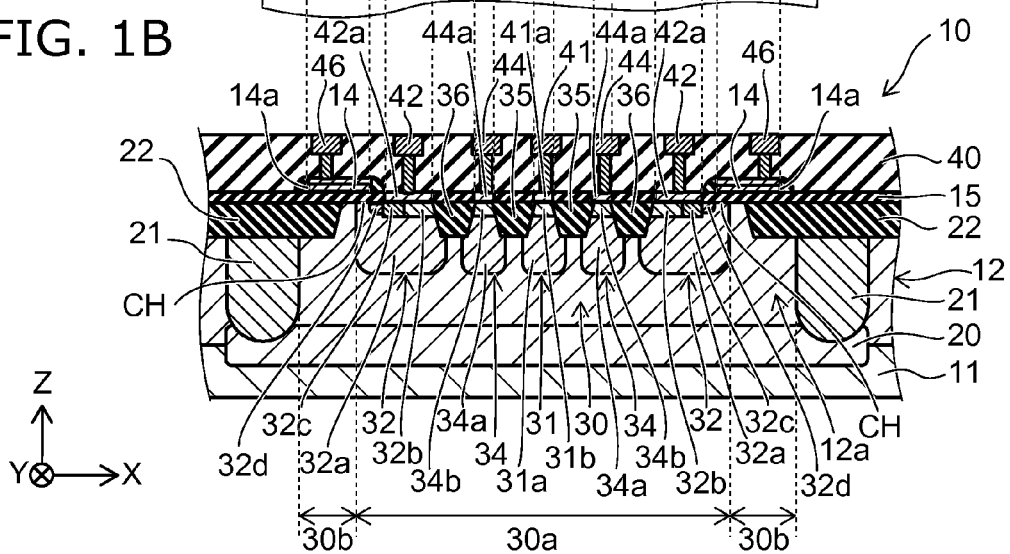

FIGS. 1A and 1B are schematic views showing part of a semiconductor device according to a first embodiment.

FIG. 1A is a schematic plan view of the semiconductor device 10. FIG. 1B is a schematic sectional view of the semiconductor device 10. FIG. 1B schematically shows a cross section taken along line A1-A2 of FIG. 1A.

As shown in FIGS. 1A and 1B, the semiconductor device 10 includes a semiconductor substrate 11, a semiconductor layer 12, an outer edge electrode 14 (first electrode), and an insulating film 15 (first insulating film).

The semiconductor substrate 11 is of p-type. The semiconductor substrate 11 is e.g. a p-type silicon substrate. The semiconductor layer 12 is provided on the semiconductor substrate 11. The semiconductor layer 12 is of p-type. The semiconductor layer 12 is a p-type epitaxial layer. The semiconductor layer 12 may be a p-type well layer. The semiconductor substrate 11 and the semiconductor layer 12 may be of n-type. That is, the semiconductor layer 12 may be an n-type epitaxial layer or an n-type well layer. Here, the stacking direction of the semiconductor substrate 11 and the semiconductor layer 12 is referred to as Z-axis direction. One direction perpendicular to the Z-axis direction is referred to as X-axis direction. The direction perpendicular to the Z-axis direction and the X-axis direction is referred to as Y-axis direction.

The semiconductor device 10 further includes a buried layer 20 and insulating parts 21, 22. The buried layer 20 is provided between the semiconductor substrate 11 and the semiconductor layer 12. The buried layer 20 is of n-type. The buried layer 20 is what is called NBL ($N^+$-type buried layer).

The insulating part 21 is provided on the buried layer 20. The insulating part 21 lies along the outer edge of the buried layer 20. The insulating part 21 is of n-type. The insulating part 21 is formed by e.g. ion implantation and diffusion processing. The insulating part 21 is what is called NISO (N-isolation). Alternatively, the insulating part 21 may be e.g. DTI (deep trench isolation).

The insulating part 22 is provided on the insulating part 21. The insulating part 22 is made of an insulating material such as silicon oxide film. The insulating part 22 is what is called STI (shallow trench isolation).

The insulating parts 21, 22 are formed in a ring shape along the outer edge of the buried layer 20. The insulating parts 21, 22 surround part of the semiconductor layer 12 about the Z-axis direction. Thus, the semiconductor layer 12 is provided with an island section 12a surrounded with the buried layer 20 and the insulating parts 21, 22. The buried layer 20 and the insulating part 21 suppress the leakage current from the island section 12a by the reverse bias of the p-n junction with the semiconductor layer 12. In the case where the semiconductor substrate 11 and the semiconductor layer 12 are of n-type, the buried layer 20 and the insulating part 21 are set to p-type. That is, the conductivity type of the buried layer 20 and the conductivity type of the insulating part 21 are different from the conductivity type of the semiconductor layer 12. In this example, the planar shape (the shape as viewed in the Z-axis direction) of the insulating parts 21, 22 and the island section 12a projected on the X-Y plane is quadrangular. The planar shape of the insulating parts 21, 22 and the island section 12a is not limited thereto. The planar shape may be shaped like a circle or other polygons. In this specification, the "ring shape" includes the case where the planar shape is polygonal, besides the case where the planar shape is circular.

The insulating parts 21, 22 do not necessarily need to surround part of the semiconductor layer 12. Part of the insulating part 21, 22 may be discontinuous. For instance, a plurality of insulating parts 21, 22 may be arranged in a ring shape along the outer edge of the buried layer 20. The buried layer 20 and the insulating parts 21, 22 are provided as needed, and can be omitted.

The island section 12a functions as a diode. That is, in this example, the semiconductor device 10 is a diode.

The island section 12a includes a p-layer 30 (first region), a first cathode region 31, a second cathode region 32, and an anode region 34. The p-layer 30 is a p-type epitaxial layer. The number of cathode regions and the number of anode regions are not limited thereto, but may be arbitrary.

The p-layer 30 includes a first portion 30a and a second portion 30b. The second portion 30b is arranged with the first portion 30a in the direction perpendicular to the Z-axis direction. The second portion 30b is arranged with the first portion 30a in e.g. the X-axis direction. The arranged direction of the second portion 30b may be an arbitrary direction perpendicular to the Z-axis direction. In the case where the insulating part 21 is provided, the second portion 30b is a portion between the first portion 30a and the insulating part 21. The second portion 30b surrounds the first portion 30a about the Z-axis direction. The second portion 30b has a ring shape surrounding the first portion 30a. The second portion 30b does not necessarily need to have a ring shape.

The first cathode region 31 is provided in the surface (upper surface) of the first portion 30a of the p-layer 30. The first cathode region 31 has a line shape extending in the Y-axis direction. The first cathode region 31 includes an n-region 31a and an $n^+$-region 31b provided on the n-region 31a. The concentration of n-type impurity contained in the $n^+$-region 31b is higher than the concentration of n-type impurity contained in the n-region 31a.

The anode region 34 is provided between the first cathode region 31 and the second portion 30b in the surface of the first portion 30a. The anode region 34 is arranged with the first cathode region 31 in the X-axis direction. The anode region 34 is formed in a ring shape surrounding the first cathode region 31 about the Z-axis direction.

The anode region 34 includes a p-region 34a and a $p^+$-region 34b provided on the p-region 34a. The concentration of p-type impurity contained in the $p^+$-region 34b is higher than the concentration of p-type impurity contained in the p-region 34a.

The second cathode region 32 is provided between the anode region 34 and the second portion 30b in the surface of the first portion 30a. The second cathode region 32 is adjacent to the second portion 30b. The second cathode region 32 is arranged with the anode region 34 in the X-axis direction. The second cathode region 32 is formed in a ring shape surrounding the anode region 34 about the Z-axis direction. The arranged direction of the first cathode region 31, the second cathode region 32, and the anode region 34 is not limited to the X-axis direction, but may be an arbitrary direction perpendicular to the Z-axis direction.

The second cathode region 32 includes an n-region 32a and an $n^+$-region 32b provided on the n-region 32a. The concentration of n-type impurity contained in the $n^+$-region 32b is higher than the concentration of n-type impurity contained in the n-region 32a.

In the island section 12a, the second cathode region 32 and the anode region 34 are formed in a ring shape. Thus, in the island section 12a, in the A1-A2 cross section, a pair of anode regions 34 are provided between a pair of second cathode regions 32. The first cathode region 31 is provided between the pair of anode regions 34.

An insulating part 35 is provided between the first cathode region 31 and the anode region 34. An insulating part 36 is provided between the anode region 34 and the second cathode region 32. The insulating part 35 is formed in a ring shape surrounding the first cathode region 31. The insulating part 36 is formed in a ring shape surrounding the anode region 34. The insulating part 35, 36 is what is called STI. Here, the insulating parts 22, 35, 36 may have a different structure such as LOCOS.

In the island section 12a, the p-layer 30 extends between the first cathode region 31 and the anode region 34 and between the anode region 34 and the second cathode region 32. Thus, a diode is formed from the p-n junction of the first cathode region 31 and the p-layer 30 and the p-n junction of the second cathode region 32 and the p-layer 30.

The second cathode region 32 further includes a $p^+$-region 32c and a p-region 32d. The $p^+$-region 32c is provided between the $n^+$-region 32b and the second portion 30b. The p-region 32d is provided between the $p^+$-region 32c and the second portion 30b. The concentration of p-type impurity contained in the $p^+$-region 32c is higher than the concentration of p-type impurity contained in the p-region 32d. The n-region 32a includes an extending part extending between the p-region 32d and the second portion 30b.

In this example, the first cathode region 31 is a second region provided in the surface of the first portion 30a. The anode region 34 is a third region. The anode region 34 is provided between the second portion 30b and the first cathode region 31 in the surface of the first portion 30a. The anode region 34 is apart from the second portion 30b and the first cathode region 31. The second cathode region 32 is a fourth region. The second cathode region 32 is provided between the second portion 30b and the anode region 34 in the surface of the first portion 30a. The second cathode region 32 is adjacent to the second portion 30b. The $p^+$-region 32c is a fifth region.

The insulating film 15 is provided on the semiconductor layer 12. The outer edge electrode 14 is formed on the insulating film 15. The outer edge electrode 14 is placed above the second cathode region 32 and above the second portion 30b. More specifically, the outer edge electrode 14 is placed above the extending part of the n-region 32a. The outer edge electrode 14 is provided at least between the $p^+$-region 32c and the second portion 30b on the semiconductor layer 12. The outer edge electrode 14 is provided astride between the $p^+$-region 32c and the insulating part 22 on the semiconductor layer 12. In the practical example, the X-axis direction end part 14a of the outer edge electrode 14 is placed on the insulating part 22. However, the placement is not limited thereto. For instance, the end part 14a may be located on the second portion 30b. The outer edge electrode 14 is formed in a ring shape along the outer edge of the $p^+$-region 32c. The outer edge electrode 14 does not necessarily need to have a ring shape. For instance, a plurality of outer edge electrodes 14 may be provided along the outer edge of the $p^+$-region 32c.

An insulating layer 40 is provided on the semiconductor layer 12. Metal wirings 41, 42, 44, 46 are provided on the insulating layer 40. For convenience, the insulating layer 40, the metal wirings 41, 42, 44, 46 and the like are not shown in FIG. 1A.

The metal wiring 41 is electrically connected to the first cathode region 31 through a pillar and a contact metal 41a. The contact metal 41a connected to the metal wiring 41 is in ohmic contact with the $n^+$-region 31b.

The metal wiring 42 is electrically connected to the second cathode region 32 through a pillar and a contact metal 42a (conductive part). The contact metal 42a connected to the metal wiring 42 is in ohmic contact with the $n^+$-region 32b and the $p^+$-region 32c.

The metal wiring 44 is electrically connected to the anode region 34 through a pillar and a contact metal 44a (conductive part). The contact metal 44a connected to the metal wiring 44 is in ohmic contact with the $p^+$-region 34b.

The metal wiring 46 is electrically connected to the outer edge electrode 14 through a pillar and a contact metal. The outer edge electrode 14 is electrically connected to the metal wirings 41, 42 through the metal wiring 46, and a wiring and the like, not shown. The outer edge electrode 14 is electrically connected to the first cathode region 31 and the second cathode region 32. In other words, the potential of the outer edge electrode 14 is substantially equal to the potential of the cathode electrode (e.g., metal wiring 41, 42). The potential of the outer edge electrode 14 may be different from the potential of the cathode electrode.

The concentration of p-type impurity contained in the second portion 30b is lower than the concentration of p-type impurity contained in the $p^+$-region 32c. The concentration of p-type impurity contained in the second portion 30b is lower than the concentration of p-type impurity contained in the p-region 32d. Furthermore, the concentration of n-type impurity contained in the second portion 30b is lower than the concentration of n-type impurity contained in the second cathode region 32. That is, the concentration of impurity contained in the second portion 30b is lower than the concentration of impurity contained in the second cathode region 32.

In this example, the first region is the p-layer 30. The second region is the first cathode region 31. The third region is the anode region 34. The fourth region is the second cathode region 32. The fifth region is the $p^+$-region 32c. The second and fourth regions are of a first conductivity type. The third and fifth regions are of a second conductivity type different from the first conductivity type. In the embodiment, the first conductivity type is n-type, and the second conductivity type is p-type. However, these may be interchanged.

In the semiconductor device 10, the n-region 32a is provided between the $p^+$-region 32c and the p-layer 30. The outer edge electrode 14 is provided via the insulating film 15 on the n-region 32a between the $p^+$-region 32c and the p-layer 30. Furthermore, in the semiconductor device 10, no electrode in ohmic contact with the semiconductor layer 12 exists on the second portion 30b. Thus, in the semiconductor device 10, a structure similar to a p-channel MOS (metal oxide semiconductor) structure is formed between the second portion 30b and an active element such as a diode on the first portion 30a. Here, the "electrode" is a conductive member electrically connected to an external device through a wiring and the like. The "electrode" may be an electrically floating conductive member. The "electrode in ohmic contact" includes e.g. a contact metal.

For instance, a voltage is applied between the cathode region 31, 32 and the anode region 34 to cause the semiconductor device 10 to function as a diode. In this state, the potential of the outer edge electrode 14 is set substantially equal to the potential of the cathode region 31, 32. Thus, a channel CH is formed in the surface of the n-region 32a below the outer edge electrode 14.

In the semiconductor device 10, holes (carriers) leaked to the second portion 30b can be returned to the first portion 30a through the channel CH, the p-region 32d, and the $p^+$-region 32c. This is because the outer edge electrode 14, the $p^+$-region 32c, the p-region 32d, and the n-region 32a are configured like a MOSFET structure. Specifically, the outer edge electrode 14 functions as a gate electrode. The $p^+$-region 32c and the p-region 32d function as a drain. The n-region 32a functions as a channel region. The $p^+$-region 32c and the p-region 32d constitute what is called an LDD (lightly doped drain). The p-region 32d is provided as needed, and can be omitted. The configuration of LDD is optional.

The structure of the outer edge electrode 14 may be regarded as the gate of a MOS transistor. Then, the surface portion below the outer edge electrode 14 in the second cathode region 32 can be regarded as a channel CH. The $p^+$-region 32c can be regarded as a drain. The anode region 34 can be regarded as a source. These can be considered as a PchMOS transistor. This transistor is located at a position different from the original device operation portion in which the current flows between the anode and the cathode. Thus, this transistor should be referred to as what is called a parasitic element. However, in general, in a MOS transistor, the gate and the channel are typically located between the source and the drain as viewed from the wafer surface. It is found that this structure is deviated therefrom. That is, the gate is not located at an intermediate position between the drain and the source, but the gate is electrically connected to the source through the deep part. This is significantly different from the structure of a typical MOS transistor. Thus, this structure is not considered as a MOS transistor, but as a structure similar to a MOS transistor.

The outer edge electrode 14 forms a channel CH in the surface of the n-region 32a. Thus, in this example, the outer edge electrode 14 only needs to be provided on the n-region 32a at least between the $p^+$-region 32c and the p-layer 30. The end part 14a of the outer edge electrode 14 may be located on e.g. the second portion 30b.

In a semiconductor device, for instance, a plurality of device sections are arranged on the semiconductor substrate. The current leaked from a device section may flow into another adjacent device section. This causes malfunctions and the like of the other device section. In this example, the device section is e.g. a portion surrounded with the second cathode region 32. The device section is substantially the same as the first portion 30a.

The outer edge electrode 14 is provided in the semiconductor device 10 according to this embodiment. Thus, the current (carrier) leaked from the first portion 30a to the second portion 30b can be returned to the first portion 30a. Accordingly, the leakage current can be suppressed in the semiconductor device 10. For instance, even in the case where a plurality of device sections are arranged, malfunctions in each device section can be suppressed. Furthermore, power consumption can also be suppressed by suppressing the leakage current. For instance, the outer edge electrode 14 is formed in the first portion 30a in a ring shape along the boundary with the second portion 30b. This can decrease current leakage paths and further suppress the leakage current.

Furthermore, in a semiconductor device, an island section is provided using a buried layer (NBL) and an insulating part (NISO). A device section is provided in the island section. Thus, the leakage current is suppressed. NISO is formed by ion implantation and diffusion processing. Accordingly, in NISO, the concentration of impurity may fail to be sufficiently high, or there may be a portion in which the concentration is partly low. This may increase the leakage current from the island section. For instance, NISO may be regarded as a parasitic bipolar transistor. In this case, the DC current amplification ratio hFE of the portion of NISO having low impurity concentration is higher than that of the portion having high impurity concentration. Thus, a relatively large current flows and causes a leakage current. Furthermore, in the case where the potential of NISO is not successfully fixed, the parasitic bipolar transistor is likely to operate under the influence of the potential of the p-type island section. This also causes the increase of leakage current. Furthermore, the parasitic bipolar transistor is likely to operate also in the case where the potential of the island section is higher than the potential of the p-type semiconductor substrate.

In the semiconductor device 10 according to this embodiment, the island section 12a is formed from the buried layer 20 and the insulating part 21. Thus, for instance, the leakage current can be made lower than in the case where the island section 12a is not formed. Furthermore, the operation of the insulating part 21 as a bipolar transistor can be suppressed also in the case where there is a portion of low concentration in part of the insulating part 21.

Conventionally, in order to suppress the leakage current, the distance between the device section and the insulating part needs to be increased, or the width of the insulating part needs to be widened. In the semiconductor device 10 according to this embodiment, compared with the case where the outer edge electrode 14 is not provided, the leakage current can be suppressed even if the distance between the device section and the insulating part 21 is decreased. The X-axis direction width of the insulating part 21 can be narrowed. In the semiconductor device 10, while suppressing the leakage current, the device size can be made smaller than in the case where e.g. the outer edge electrode 14 is not provided.

Figure 2A:
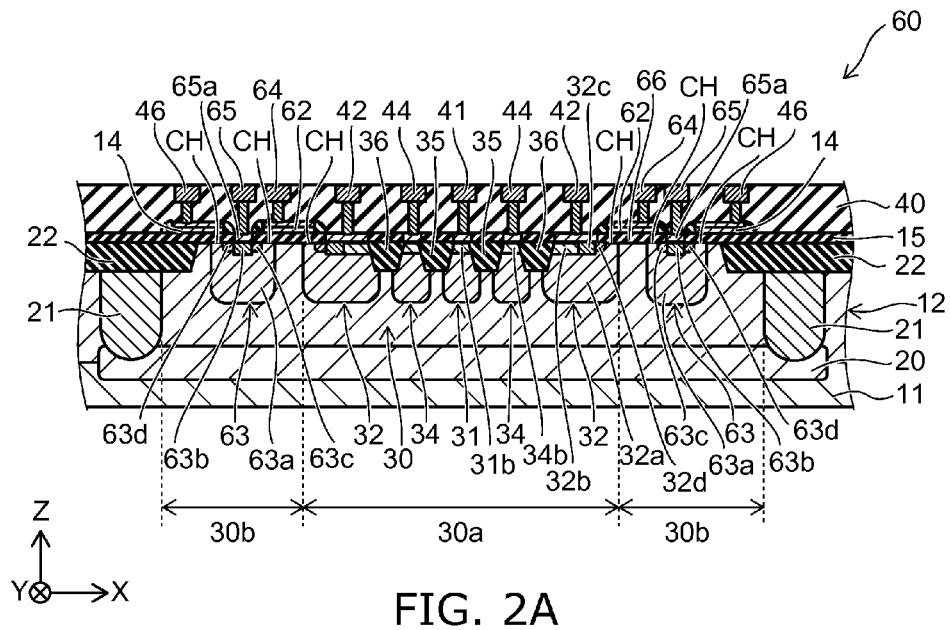
FIGS. 2A and 2B are schematic sectional views showing variations of the first embodiment.
Figure 2B:
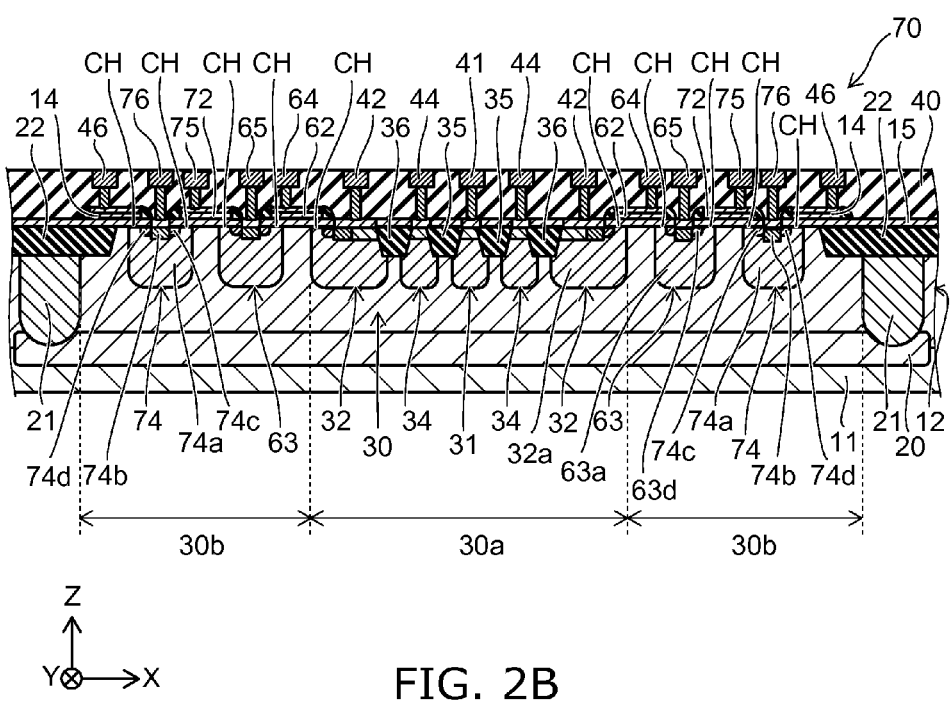

FIGS. 2A and 2B are schematic sectional views showing variations of the first embodiment.

As shown in FIG. 2A, the semiconductor device 60 further includes an intermediate electrode 62. The semiconductor layer 12 of the semiconductor device 60 further includes an impurity region 63. Here, the components having substantially the same function or configuration as those of the above embodiment are labeled with like reference numerals, and the detailed description thereof is omitted.

The impurity region 63 is provided in the surface of the second portion 30b. The impurity region 63 is arranged with the second cathode region 32 in the X-axis direction. The impurity region 63 is formed in a ring shape surrounding the second cathode region 32 about the Z-axis direction. Also in this example, the device section is a portion surrounded with the second cathode region 32.

The impurity region 63 includes an n-region 63a, a $p^+$-region 63b, a p-region 63c, and a p-region 63d. The n-region 63a is provided in the surface of the p-layer 30. The $p^+$-region 63b is provided in the surface of the n-region 63a. The p-region 63c is provided between the $p^+$-region 63b and the second cathode region 32. The p-region 63d is provided between the $p^+$-region 63b and the insulating part 22.

In the impurity region 63, the n-region 63a extends between the p-region 63c and the second cathode region 32. The n-region 63a extends between the p-region 63d and the insulating part 22.

The concentration of p-type impurity contained in the p$^+$-region 63b is higher than the concentration of p-type impurity contained in the p-region 63c. The concentration of p-type impurity contained in the p$^+$-region 63b is higher than the concentration of p-type impurity contained in the p-region 63d. Here, the configuration of the p-regions 63c, 63d is optional. The maximum concentration of p-type impurity contained in the second portion 30b is lower than the maximum concentration of p-type impurity contained in the impurity region 63.

In the semiconductor device 60, the outer edge electrode 14 has one end placed on the impurity region 63, and is arranged in the X-axis direction with the intermediate electrode 62 on the semiconductor layer 12.

The intermediate electrode 62 is provided between the p$^+$-region 32c and the impurity region 63. The intermediate electrode 62 is provided astride on the second cathode region 32 and on the impurity region 63. The intermediate electrode 62 is placed on the n-region 32a between the p-region 32d and the impurity region 63. The intermediate electrode 62 is placed on the n-region 63a between the p-region 63c and the second cathode region 32. An insulating film 66 is provided between the intermediate electrode 62 and the semiconductor layer 12. This insulating film 66 may be integrated with e.g. the insulating film 15. In other words, the insulating film 15 may extend between the intermediate electrode 62 and the semiconductor layer 12.

In this example, the impurity region 63 is a first impurity region. The p$^+$-region 63b is a second impurity region. The intermediate electrode 62 is a first electrode. The outer edge electrode 14 is a second electrode.

Metal wirings 64, 65 are further provided on the insulating layer 40. The metal wiring 64 is electrically connected to the intermediate electrode 62 through a pillar and a contact metal. The intermediate electrode 62 is electrically connected to the outer edge electrode 14 through the metal wirings 46, 64 and the like. The potential of the intermediate electrode 62 is substantially equal to the potential of the outer edge electrode 14. The potential of the intermediate electrode 62 may be different from the potential of the outer edge electrode 14.

The metal wiring 65 is electrically connected to the impurity region 63 through a pillar and a contact metal 65a. The contact metal 65a connected to the metal wiring 65 is in ohmic contact with the p$^+$-region 63b. The second cathode region 32 is electrically connected to the impurity region 63 through the metal wirings 42, 65 and the like.

In the semiconductor device 60, for instance, a voltage is applied between the cathode region 31, 32 and the anode region 34 to cause the semiconductor device 60 to function as a diode. In this state, the potential of the outer edge electrode 14 and the potential of the intermediate electrode 62 are set substantially equal to the potential of the cathode region 31, 32. Thus, in the semiconductor device 60, channels CH are formed at three sites, i.e., in the surface of the n-region 63a below the outer edge electrode 14, the surface of the n-region 63a below the intermediate electrode 62, and the surface of the n-region 32a below the intermediate electrode 62.

Thus, a plurality of channels CH are formed near the outer edge of the first portion 30a. Accordingly, the leakage current can be suppressed further than in the case where there is one channel CH.

As shown in FIG. 2B, the semiconductor device 70 further includes an intermediate electrode 72. The semiconductor layer 12 of the semiconductor device 70 further includes an impurity region 74.

The impurity region 74 is provided in the surface of the second portion 30b. The impurity region 74 is arranged with the impurity region 63 in the X-axis direction. The impurity region 74 is provided between the impurity region 63 and the insulating part 22. The impurity region 74 includes an n-region 74a, a p$^+$-region 74b, a p-region 74c, and a p-region 74d. The impurity region 74 is similar to the impurity region 63. Thus, the detailed description of the impurity region 74 is omitted.

In the semiconductor device 70, the outer edge electrode 14 is placed on the impurity region 74 and on the second portion 30b. The outer edge electrode 14 is placed on the n-region 74a between the p-region 74d and the p-layer 30.

The intermediate electrode 72 is provided astride on the impurity region 63 and on the impurity region 74. The intermediate electrode 72 is placed on the n-region 63a between the p-region 63d and the impurity region 74. The intermediate electrode 72 is placed on the n-region 74a between the p-region 74c and the impurity region 63. An insulating film is provided between the intermediate electrode 72 and the semiconductor layer 12. This insulating film may be integrated with e.g. the insulating film 15. In other words, the insulating film 15 may extend between the intermediate electrode 72 and the semiconductor layer 12.

Metal wirings 75, 76 are further provided on the insulating layer 40. The metal wiring 75 is electrically connected to the intermediate electrode 72 through a pillar and a contact metal. The intermediate electrode 72 is electrically connected to the outer edge electrode 14 through the metal wirings 46, 75 and the like. The potential of the intermediate electrode 72 is substantially equal to the potential of the outer edge electrode 14. The potential of the intermediate electrode 72 may be different from the potential of the outer edge electrode 14.

The metal wiring 76 is electrically connected to the impurity region 74 through a pillar and a contact metal. The contact metal connected to the metal wiring 76 is in ohmic contact with the p$^+$-region 74b. The second cathode region 32 is electrically connected to the impurity region 74 through the metal wirings 42, 76 and the like.

In the semiconductor device 70, for instance, a voltage is applied between the cathode region 31, 32 and the anode region 34 to cause the semiconductor device 70 to function as a diode. In this state, the potential of the outer edge electrode 14 and the potential of the intermediate electrode 62, 72 are set substantially equal to the potential of the cathode region 31, 32.

Thus, in the semiconductor device 70, channels CH are formed at five sites, i.e., in the surface of the n-region 74a below the outer edge electrode 14, the surface of the n-region 63a below the intermediate electrode 62, the surface of the n-region 32a below the intermediate electrode 62, the surface of the n-region 63a below the intermediate electrode 72, and the surface of the n-region 74a below the intermediate electrode 72.

Thus, five channels CH are formed. Accordingly, the leakage current can be suppressed further than in the case of e.g. three sites. The number of channels CH formed may be one or a plurality.

Figure 3A:
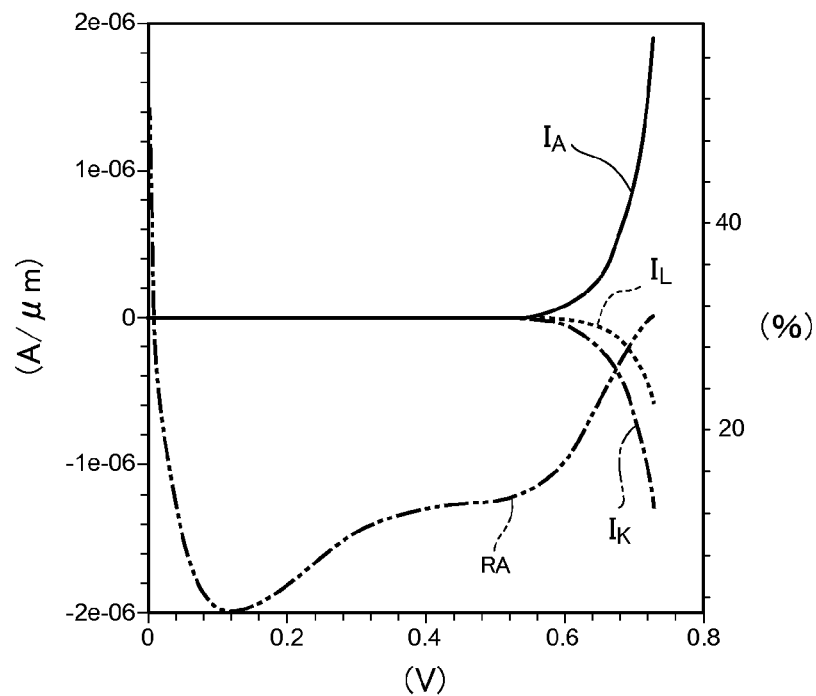
FIGS. 3A and 3B are graphs showing example characteristics of the semiconductor device according to the first embodiment.
Figure 3B:
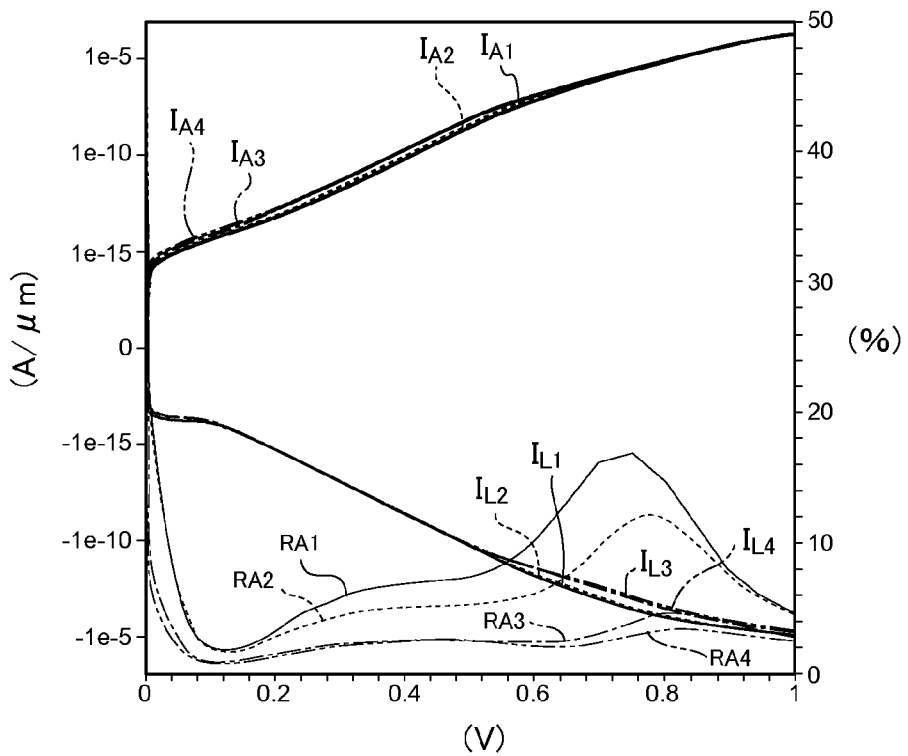

FIGS. 3A and 3B are graphs showing example characteristics of the semiconductor device according to the first embodiment.

FIG. 3A shows the characteristics of a semiconductor device of a reference example lacking the outer edge electrode 14. FIG. 3B shows the characteristics of the semiconductor devices 10, 60, 70 according to this embodiment.

In FIG. 3A, $I_A$ is an example of the anode current. $I_K$ is an example of the cathode current. $I_L$ is an example of the leakage current. RA is an example of the absolute value of the ratio of leakage current to anode current ($|I_L/I_A|$). The current is measured as positive in the direction flowing into the device, and negative in the direction flowing out of the device. Thus, in this example, the anode current $I_A$ is positive, and the cathode current $I_K$ is negative. The leakage current $I_L$ is, in other words, the difference ($|I_K|-|I_A|$) between the absolute value of the anode current $I_A$ and the absolute value of the cathode current $I_K$.

In FIG. 3B, $I_{A1}$, $I_{A2}$ are examples of the anode current of the semiconductor device 10. $I_{L1}$, $I_{L2}$ are examples of the leakage current of the semiconductor device 10. RA1, RA2 are examples of the ratio of leakage current to anode current of the semiconductor device 10. $I_{A3}$ is an example of the anode current of the semiconductor device 60. $I_{L3}$ is an example of the leakage current of the semiconductor device 60. RA3 is an example of the ratio of leakage current to anode current of the semiconductor device 60. $I_{A4}$ is an example of the anode current of the semiconductor device 70. $I_{L4}$ is an example of the leakage current of the semiconductor device 70. RA4 is an example of the ratio of leakage current to anode current of the semiconductor device 70. That is, the ratios RA1-RA4 represent the proportion of the leakage current to the total current.

$I_{A1}$, $I_{L1}$, RA1 are examples of the characteristics in the state of the semiconductor device 10 in which no voltage is applied to the outer edge electrode 14. In other words, they are examples of the characteristics in the state in which no operation for forming the channel CH is performed. On the other hand, $I_{A2}$, $I_{L2}$, RA2 are examples of the characteristics in the state of the semiconductor device 10 in which a voltage is applied to the outer edge electrode 14. In other words, they are examples of the characteristics in the state in which the operation for forming the channel CH is performed.

The horizontal axis of FIGS. 3A and 3B represents anode-cathode forward voltage (V). The left vertical axis of FIGS. 3A and 3B represents the current per length of 1 µm in the Y-axis direction (A/µm). The right vertical axis of FIGS. 3A and 3B represents the ratio (%) of leakage current to anode current.

As shown in FIG. 3A, in the semiconductor device of the reference example lacking the outer edge electrode 14, the maximum of the ratio RA is approximately 32%. As shown in FIG. 3B, the maximum of the ratio RA1 of the semiconductor device 10 is approximately 18%. The maximum of the ratio RA2 of the semiconductor device 10 is approximately 12%. The maximum of the ratio RA3 of the semiconductor device 60 is approximately 5%. The maximum of the ratio RA4 of the semiconductor device 70 is approximately 3%.

Thus, the leakage current can be suppressed by providing the outer edge electrode 14. By applying a voltage to the outer edge electrode 14 and forming a channel CH below the outer edge electrode 14, the leakage current can be suppressed further than in the case where no channel CH is formed. The leakage current can be further suppressed by further providing an intermediate electrode 62 so that the number of channels CH formed is increased to three. The leakage current can be further suppressed by further providing an intermediate electrode 72 so that the number of channels CH is increased from three to five.

However, the proportion of reduction of the leakage current in the case of increasing the number of channels CH from three to five is smaller than the proportion of reduction of the leakage current in the case of increasing the number of channels CH from one to three. Thus, preferably, the number of channels CH is set to approximately three. Accordingly, while suppressing the leakage current, the upsizing of the semiconductor device can be suppressed relative to the case where five or more channels CH are formed.

Figure 4:
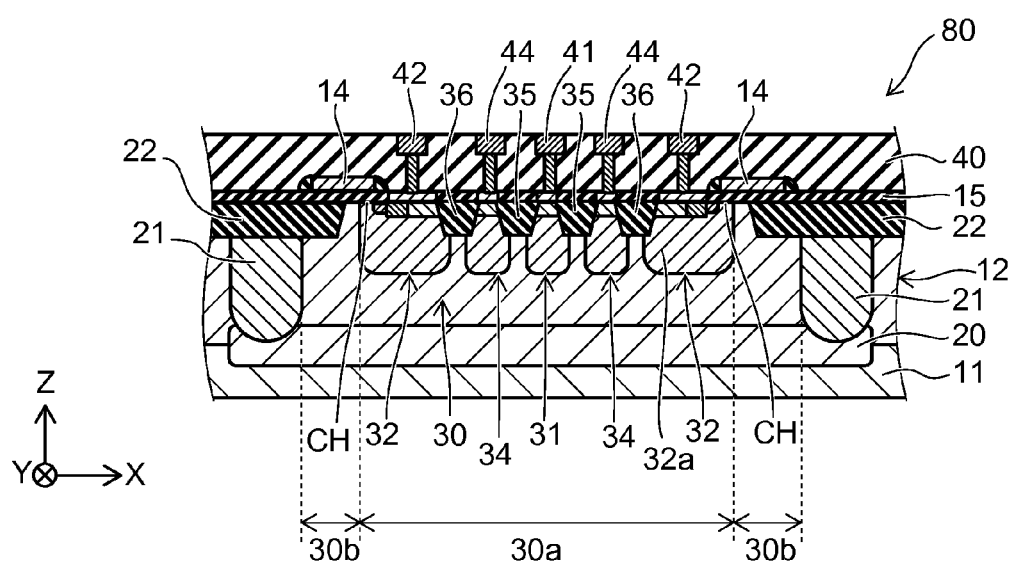
FIG. 4 is a schematic sectional view showing a variation of the first embodiment.

FIG. 4 is a schematic sectional view showing a variation of the first embodiment.

As shown in FIG. 4, in the semiconductor device 80, the metal wirings on the outer edge electrode 14 are omitted. In the semiconductor device 80, the outer edge electrode 14 is electrically floating. Thus, the outer edge electrode 14 does not necessarily need to be electrically connected to the second cathode region 32 and the like.

Preferably, the threshold voltage for forming the channel CH is lower. Preferably, the pseudo-MOS structure of the outer edge electrode 14 is of the depression type. That is, preferably, a channel CH is formed also in the state in which no voltage is applied to the outer edge electrode 14. Thus, the leakage current can be suppressed also in the case where the outer edge electrode 14 is made electrically floating as in the semiconductor device 80.

For instance, the X-axis direction length of the channel CH is decreased. The concentration of impurity of the n-region 32a (the region where the channel CH is formed) is lowered. This can lower the threshold voltage. Thus, the MOS structure of the outer edge electrode 14 can be set to the depression type.

Second Embodiment

Figure 5A:
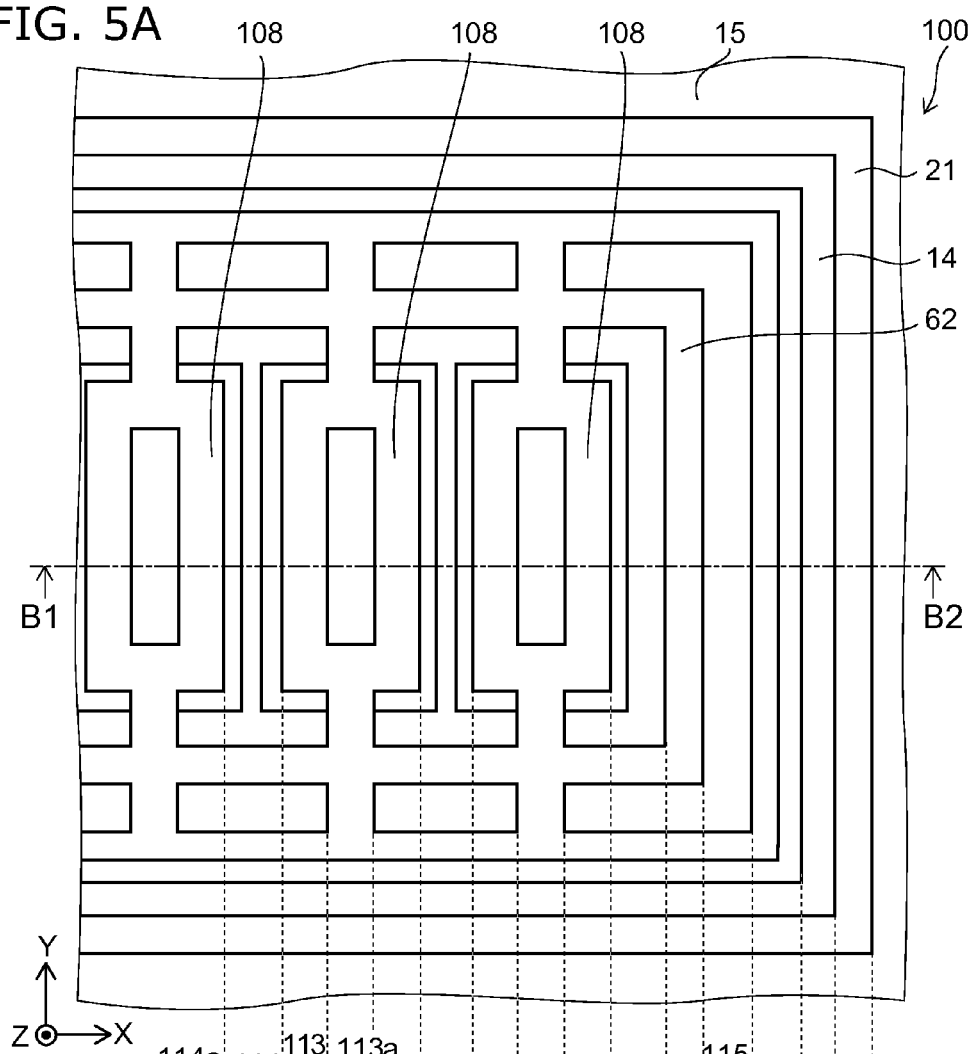
FIGS. 5A and 5B are schematic views showing part of a semiconductor device according to a second embodiment.
Figure 5B:
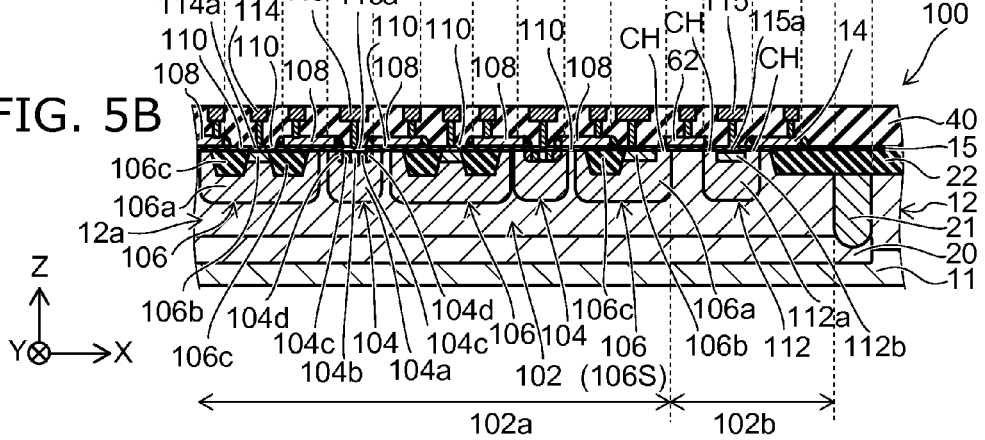

FIGS. 5A and 5B are schematic views showing part of a semiconductor device according to a second embodiment.

FIG. 5A is a schematic plan view of the semiconductor device 100. FIG. 5B is a schematic sectional view of the semiconductor device 100. FIG. 5B schematically shows a cross section taken along line B1-B2 of FIG. 5A. As in the above first embodiment, for convenience, the insulating layer 40 and the like are not shown in FIG. 5A.

As shown in FIGS. 5A and 5B, the semiconductor layer 12 of the semiconductor device 100 includes a p-epitaxial layer 102 (first region), a source region 104, and a drain region 106. The p-epitaxial layer 102 is provided in the island section 12a. The p-epitaxial layer 102 includes a first portion 102a and a second portion 102b. The second portion 102b is arranged with the first portion 102a in the X-axis direction. The second portion 102b is provided between the first portion 102a and the insulating part 21. The second portion 102b surrounds the first portion 102a about the Z-axis direction. The second portion 102b has a ring shape surrounding the first portion 102a. The source region 104 and the drain region 106 are provided in the surface of the first portion 102a of the p-epitaxial layer 102. In this example, the semiconductor layer 12 includes a plurality of source regions 104 and a plurality of drain regions 106. The source regions 104 and the drain regions 106 are arranged alternately in the X-axis direction. In this example, the drain region 106 is placed in the outermost part of the X-axis direction. Conversely, the source region 104 may be placed in the outermost part. The number of source regions 104 and drain regions 106 may be one for each.

The source region 104 includes a p-well region 104a, a $p^+$-region 104b, an $n^+$-region 104c, and an n-region 104d. The concentration of p-type impurity contained in the p-well region 104a is higher than the concentration of p-type impurity contained in the p-epitaxial layer 102. The $p^+$-region 104b is provided in the surface of the p-well region 104a. The concentration of p-type impurity contained in the p+-region 104b is higher than the concentration of p-type impurity contained in the p-well region 104a. The n+-region 104c is provided between the p+-region 104b and the drain region 106. The n-region 104d is provided between the n+-region 104c and the drain region 106. The n-region 104d constitutes an LDD in conjunction with the n+-region 104c. The n-region 104d is provided as needed, and can be omitted. In this example, the p-well region 104a extends between the n-region 104d and the drain region 106.

The drain region 106 includes an n-region 106a, an n+-region 106b, and an insulating part 106c. The n+-region 106b is provided on the n-region 106a. The concentration of n-type impurity contained in the n+-region 106b is higher than the concentration of n-type impurity contained in the n-region 106a. The insulating part 106c is provided between the n+-region 106b and the source region 104. The insulating part 106c is what is called STI. The distance between the insulating part 106c and the semiconductor substrate 11 is shorter than the distance between the n+-region 106b and the semiconductor substrate 11. In other words, in the semiconductor layer 12, the position of the lower end of the insulating part 106c is deeper than the position of the lower end of the n+-region 106b.

The semiconductor device 100 includes a plurality of gate electrodes 108 (control electrodes) and a plurality of gate insulating films 110 (control insulating films). The gate electrode 108 is formed astride on the p+-region 104b and the insulating part 106c. That is, the gate electrode 108 is formed on the p-well region 104a. The gate insulating film 110 is provided between the p-epitaxial layer 102 and the gate electrode 108. The number of gate electrodes 108 and the number of gate insulating films 110 are set depending on the number of source regions 104 and the number of drain regions 106. The number of gate electrodes 108 and gate insulating films 110 may be one for each.

In the semiconductor device 100, an n-channel MOS structure is formed from the n+-region 104c of the source region 104, the n+-region 106b of the drain region 106, and the p-well region 104a between the n+-region 104c and the n+-region 106b.

The semiconductor device 100 functions as what is called an n-channel LDMOS (lateral double diffused MOSFET). That is, in this example, the semiconductor device 100 is an LDMOS.

The semiconductor device 100 further includes an intermediate electrode 62 and an n-region 112. The n-region 112 is provided between the second portion 102b and the drain region 106s located in the outermost part of the X-axis direction of the first portion 102a. The n-region 112 includes an n-region 112a and an n+-region 112b provided on the n-region 112a. The n+-region 112b is electrically connected to the n+-region 106b of the drain region 106.

In the semiconductor device 100, the source region 104 is a second region. The drain region 106 is a third region.

The intermediate electrode 62 is provided astride on the outermost drain region 106s and on the n-region 112. An insulating film is provided between the intermediate electrode 62 and the p-epitaxial layer 102.

The outer edge electrode 14 is provided astride on the n-region 112 and on the second portion 102b. The outer edge electrode 14 is formed in a ring shape along the second portion 102b. The outer edge electrode 14 is formed so as to surround the first portion 102a. In this example, the outer edge electrode 14 is electrically connected to the gate electrode 108. The outer edge electrode 14 may be electrically floating.

Metal wirings 113, 114, 115 are provided on the insulating layer 40. The metal wiring 113 is electrically connected to the source region 104 through a pillar and a contact metal 113a. The contact metal 113a is in ohmic contact with the p+-region 104b and the n+-region 104c. The metal wiring 114 is electrically connected to the drain region 106 through a pillar and a contact metal 114a. The contact metal 114a is in ohmic contact with the n+-region 106b. The metal wiring 115 is electrically connected to the n-region 112 through a pillar and a contact metal 115a. The contact metal 115a is in ohmic contact with the n+-region 112b.

For instance, a voltage is applied between the source region 104 and the drain region 106, and a voltage is applied to the gate electrode 108. Thus, a current is passed between the source and the drain. In this state, the potential of the outer edge electrode 14 and the potential of the intermediate electrode 62 are set substantially equal to the potential of the gate electrode 108. Thus, in the semiconductor device 100, channels CH are formed at three sites, i.e., in the surface of the n-region 112a below the outer edge electrode 14, the surface of the n-region 112a below the intermediate electrode 62, and the surface of the n-region 106a below the intermediate electrode 62. Accordingly, as in the above first embodiment, the leakage current is suppressed also in the semiconductor device 100 of the n-channel LDMOS.

In LDMOS, a relatively large voltage is applied between the source and the drain. Thus, the leakage current tends to increase. In such a semiconductor device (e.g., a device of the high breakdown voltage type) provided with an outer edge electrode 14 and an intermediate electrode 62, suppression of leakage current is greater than in the case of the device operated under a lower voltage.

In a semiconductor device such as LDMOS, a dummy gate electrode is often formed at the outer edge of the first portion 102a. This can suppress the deformation of the resist for forming the gate electrode 108 to enhance the formation accuracy of the gate electrode 108. In the semiconductor device 100, there is no need to provide a dummy electrode and the like. The deformation of the resist can be suppressed by the outer edge electrode 14. For instance, the outer edge electrode 14 and the gate electrode 108 can be formed with high accuracy. In the semiconductor device 100, for instance, a dummy electrode may be provided on the insulating part 22. In this case, the dummy electrode is not in ohmic contact with the semiconductor layer 12. Thus, also in the semiconductor device 100, no electrode in ohmic contact with the semiconductor layer 12 is provided in the portion outside the outer edge electrode 14.

Figure 6:
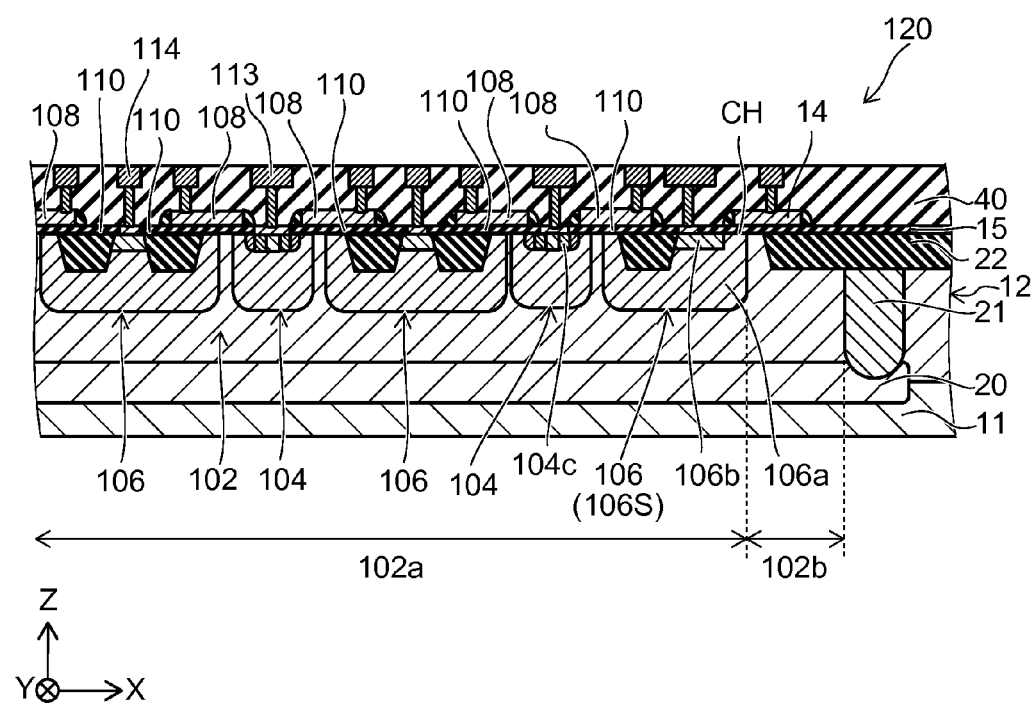
FIG. 6 is a schematic sectional view showing a variation of the second embodiment.

FIG. 6 is a schematic sectional view showing a variation of the second embodiment.

As shown in FIG. 6, in the semiconductor device 120, the intermediate electrode 62 and the n-region 112 are omitted.

In the semiconductor device 120, the outermost drain region 106s is adjacent to the second portion 102b. In the semiconductor device 120, the drain region 106s is a third region. The source region 104 is a second region. The outer edge electrode 14 is provided astride on the outermost drain region 106s and on the second portion 102b.

For instance, a voltage is applied between the source region 104 and the drain region 106, and a voltage is applied to the gate electrode 108. Thus, a current is passed between the source and the drain. In this state, the potential of the outer edge electrode 14 is set substantially equal to the potential of the gate electrode 108. Thus, in the semiconductor device 120, a channel CH is formed in the surface of the n-region 106a below the outer edge electrode 14.

Thus, in the semiconductor device 120 of the n-channel LDMOS, the number of channels CH formed may be one. In the semiconductor device 120 of the n-channel LDMOS, the number of channels CH formed may be four or more.

FIGS. 7A and 7B are schematic views showing a variation of the second embodiment.

FIG. 7A is a schematic plan view of a semiconductor device 130. FIG. 7B is a schematic sectional view of the semiconductor device 130. FIG. 7B schematically shows a cross section taken along line C1-C2 of FIG. 7A. For convenience, the insulating layer 40 and the like are not shown in FIG. 7A.

As shown in FIGS. 7A and 7B, in the semiconductor device 130, in the source region 104, the p-well region 104a of the aforementioned semiconductor device 120 is replaced by an n-well region 104e. The p$^+$-region 104b is replaced by an n$^+$-region 104f. The n$^+$-region 104c is replaced by a p$^+$-region 104g. The n-region 104d is replaced by a p-region 104h. The p-region 104h constitutes an LDD in conjunction with the p$^+$-region 104g. The p-region 104h is provided as needed, and can be omitted.

In the semiconductor device 130, in the drain region 106, the n-region 106a of the aforementioned semiconductor device 120 is replaced by a p-region 106d. The n$^+$-region 106b is replaced by a p$^+$-region 106e.

Furthermore, in the semiconductor device 130, in the n-region 112, the n-region 112a of the aforementioned semiconductor device 120 is replaced by a p-region 112c. The n$^+$-region 112b is replaced by a p$^+$-region 112d.

The semiconductor layer 12 of the semiconductor device 130 further includes n-regions 132, 134. The n-region 132 is provided between the outermost drain region 106s and the n-region 112. The n-region 134 is provided between the n-region 112 and the insulating part 22.

The n-region 134 is placed in the second portion 102b. The concentration of n-type impurity contained in the n-region 134 is lower than the concentration of p-type impurity contained in the p$^+$-region 112d of the n-region 112. Thus, the concentration of impurity contained in the second portion 102b is lower than the concentration of impurity contained in the n-region 112.

In the semiconductor device 130, a p-channel MOS structure is formed from the p$^+$-region 104g of the source region 104, the p$^+$-region 106e of the drain region 106, and the n-well region 104e between the p$^+$-region 104g and the p$^+$-region 106e. The semiconductor device 130 functions as a p-channel LDMOS. In this example, the semiconductor device 130 is a p-channel LDMOS.

For instance, a voltage is applied between the source region 104 and the drain region 106, and a voltage is applied to the gate electrode 108. Thus, a current is passed between the source and the drain. In this state, the potential of the outer edge electrode 14 and the potential of the intermediate electrode 62 are set substantially equal to the potential of the gate electrode 108. Thus, in the semiconductor device 130, channels CH are formed at three sites, i.e., in the surface of the p-region 112c below the outer edge electrode 14, the surface of the p-region 112c below the intermediate electrode 62, and the surface of the p-region 106d below the intermediate electrode 62. Accordingly, the leakage current is suppressed also in the semiconductor device 130 of the p-channel LDMOS.

Thus, the semiconductor device 130 may be a p-channel LDMOS. As in the aforementioned semiconductor device 120, the intermediate electrode 62 and the n-region 112 can be omitted also in the semiconductor device of the p-channel LDMOS. That is, in the semiconductor device of the p-channel LDMOS, the number of channels CH formed may be one.

In the semiconductor device of the p-channel LDMOS, the number of channels CH formed may be four or more. Also in the semiconductor device 130, no electrode in ohmic contact with the semiconductor layer 12 exists in the portion outside the outer edge electrode 14.

Third Embodiment

Figure 8A:
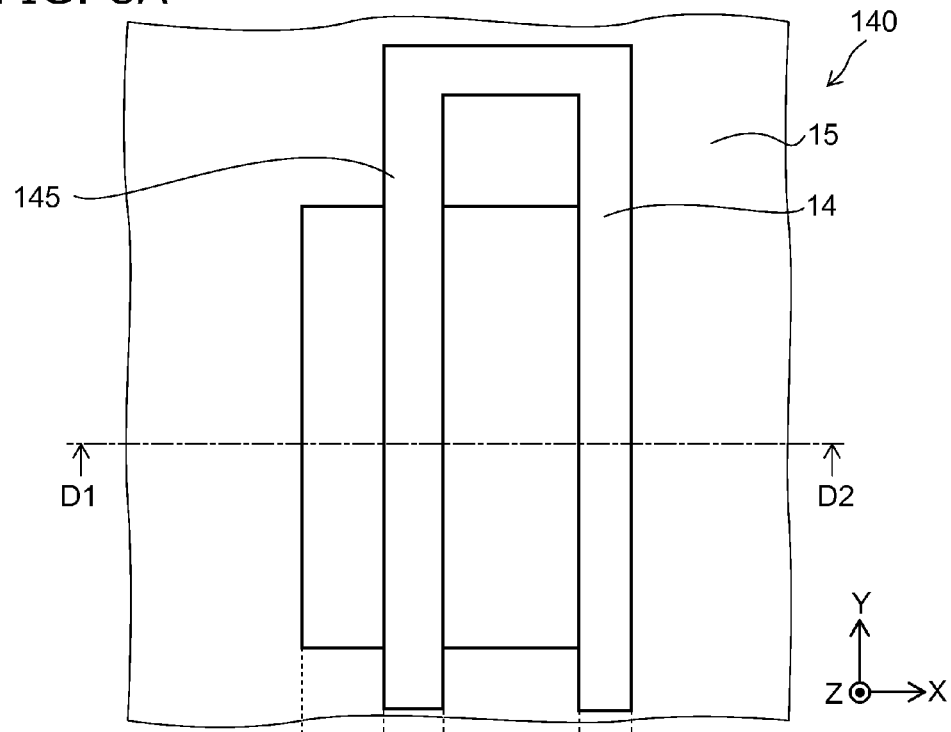
FIGS. 8A and 8B are schematic views showing part of a semiconductor device according to a third embodiment.
Figure 8B:
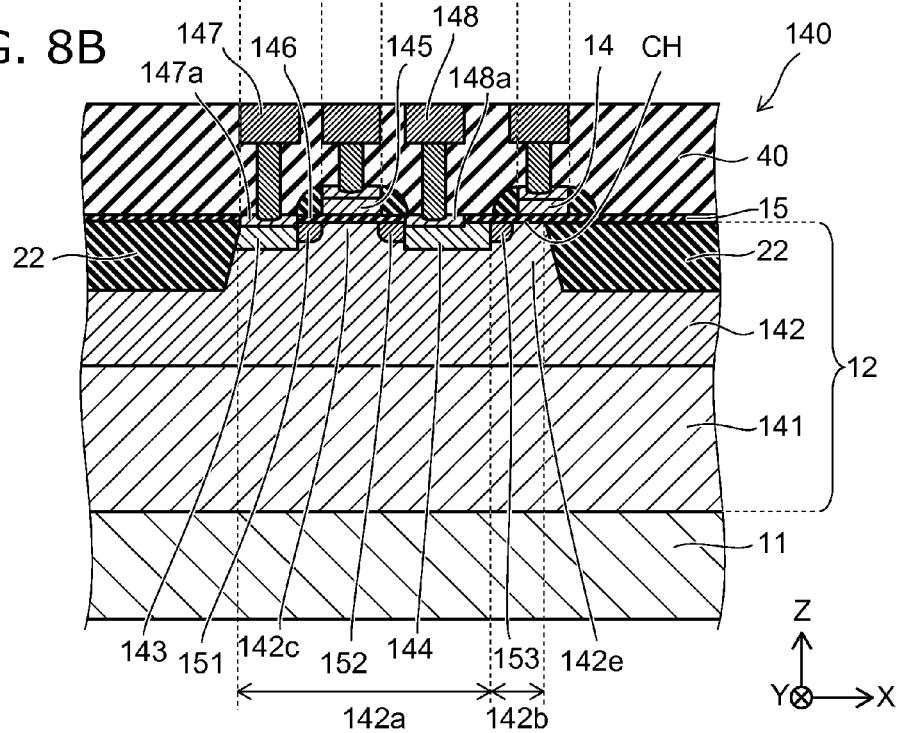

FIGS. 8A and 8B are schematic views showing part of a semiconductor device according to a third embodiment.

FIG. 8A is a schematic plan view of the semiconductor device 140. FIG. 8B is a schematic sectional view of the semiconductor device 140. FIG. 8B schematically shows a cross section taken along line D1-D2 of FIG. 8A. As in the above embodiments, for convenience, the insulating layer 40 and the like are not shown in FIG. 8A.

As shown in FIGS. 8A and 8B, the semiconductor layer 12 of the semiconductor device 140 includes a p-epitaxial layer 141, a p-well region 142 (first region), an n$^+$-region 143 (second region), an n$^+$-region 144 (third region), a gate electrode 145 (control electrode), and a gate insulating film 146 (control insulating film).

The p-epitaxial layer 141 is provided on the semiconductor substrate 11. The p-well region 142 is provided on the p-epitaxial layer 141. The p-well region 142 includes a first portion 142a and a second portion 142b. The second portion 142b is arranged with the first portion 142a in e.g. the X-axis direction. The arranged direction of the second portion 142b may be an arbitrary direction perpendicular to the Z-axis direction. The n$^+$-region 143 is provided in the surface of the first portion 142a of the p-well region 142. The n$^+$-region 144 is provided in the surface of the first portion 142a of the p-well region 142. The n$^+$-region 144 is provided between the n$^+$-region 143 and the second portion 142b. The n$^+$-region 144 is adjacent to the second portion 142b. The n$^+$-region 144 is apart from the n$^+$-region 143.

The first portion 142a is e.g. a portion of the p-well region 142 between the end part of the n$^+$-region 143 and the end part of the n$^+$-region 144. The second portion 142b is e.g. a portion between the first portion 142a and the insulating part 22. The semiconductor layer 12 may include a plurality of devices, and include no insulating part 22 between the devices. In this case, the second portion 142b is e.g. a portion between the first portion 142a and the first portion 142a of the adjacent device.

The p-well region 142 includes a channel part 142c extending between the n$^+$-region 143 and the n$^+$-region 144. The gate electrode 145 is provided on the channel part 142c. The gate insulating film 146 is provided between the channel part 142c and the gate electrode 145.

The semiconductor layer 12 of the semiconductor device 140 further includes n-regions 151, 152, 153. The n-region 151 is provided between the n$^+$-region 143 and the channel part 142c. The n-region 152 is provided between the n$^+$-region 144 and the channel part 142c. The n-region 153 is provided between the n$^+$-region 143 and the second portion 142b. The concentration of n-type impurity contained in the n-regions 151, 152, 153 is lower than the concentration of n-type impurity contained in the n$^+$-regions 143, 144.

The insulating film 15 is provided adjacent to the n$^+$-region 144 on the second portion 142b. The outer edge electrode 14 is provided on the insulating film 15. The outer edge electrode 14 is electrically connected to the gate electrode 145. The outer edge electrode 14 may be electrically floating. Also in the semiconductor device 140, no electrode in ohmic contact with the semiconductor layer 12 exists in the portion outside the outer edge electrode 14.

In the semiconductor device 140, an n-channel MOS structure is formed from the n$^+$-region 143, the n$^+$-region 144, and the p-well region 142 (channel part 142c) between the n$^+$-region 143 and the n$^+$-region 144. That is, in this example, the semiconductor device 140 is an n-channel MOSFET (metal-oxide-semiconductor field-effect transistor). The n$^+$-region 143 is a source region. The n$^+$-region 144 is a drain region. Alternatively, the n$^+$-region 143 may be a drain region, and the n$^+$-region 144 may be a source region. The n-regions 151, 152 constitute an LDD in conjunction with the n$^+$-regions 143, 144. The n-regions 151, 152 are provided as needed, and can be omitted.

Metal wirings 147, 148 are provided on the insulating layer 40. The metal wiring 147 is electrically connected to the n$^+$-region 143 through a pillar and a contact metal 147a. The contact metal 147a is in ohmic contact with the n$^+$-region 143. The metal wiring 148 is electrically connected to the n$^+$-region 144 through a pillar and a contact metal 148a. The contact metal 148a is in ohmic contact with the n$^+$-region 144.

For instance, a voltage is applied between the n$^+$-regions 143, 144, and a voltage is applied to the gate electrode 145. Thus, a current is passed between the source and the drain. In this state, the potential of the outer edge electrode 14 is set substantially equal to the potential of the gate electrode 145. Thus, in the semiconductor device 140, a channel CH is formed in the surface of the p-well region 142 below the outer edge electrode 14. Here, the n-region 153 may be omitted. Thus, as in the above embodiments, the leakage current is suppressed also in the semiconductor device 140 of the n-channel MOSFET. In the semiconductor device 140 of the n-channel MOSFET, the number of channels CH formed may be two or more.

Figure 9A:
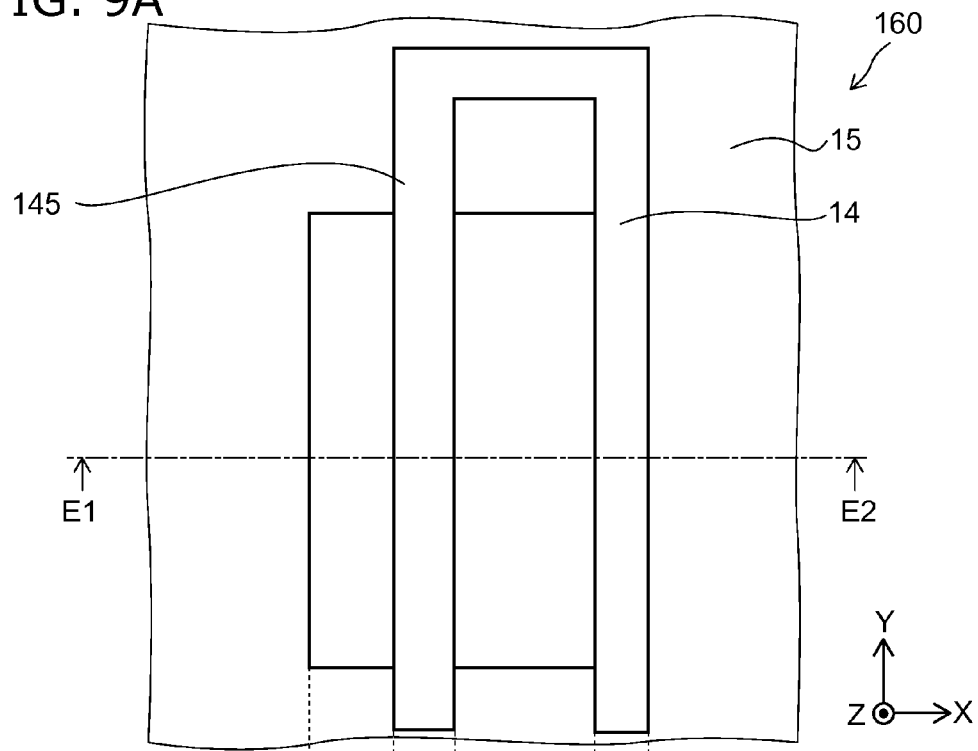
FIGS. 9A and 9B are schematic views showing a variation of the third embodiment.
Figure 9B:
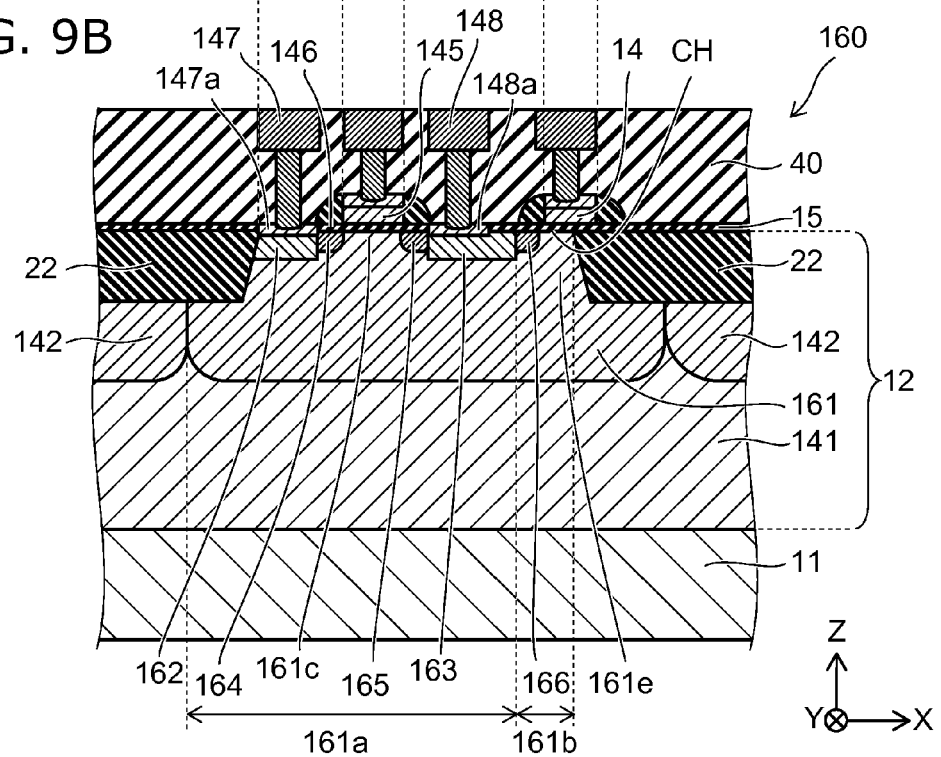

FIGS. 9A and 9B are schematic views showing a variation of the third embodiment.

FIG. 9A is a schematic plan view of a semiconductor device 160. FIG. 9B is a schematic sectional view of the semiconductor device 160. FIG. 9B schematically shows a cross section taken along line E1-E2 of FIG. 9A. As in the above embodiments, for convenience, the insulating layer 40 and the like are not shown in FIG. 9A.

As shown in FIGS. 9A and 9B, the semiconductor layer 12 of the semiconductor device 160 includes an n-well region 161 (first region). The n-well region 161 is provided on the p-epitaxial layer 141. The n-well region 161 includes a first portion 161a and a second portion 161b. The second portion 161b is arranged with the first portion 161a in e.g. the X-axis direction. The arranged direction of the second portion 161b may be an arbitrary direction perpendicular to the Z-axis direction.

In the semiconductor device 160, the n$^+$-region 143 of the aforementioned semiconductor device 140 is replaced by a p$^+$-region 162. The n$^+$-region 144 is replaced by a p$^+$-region 163. The n-regions 151, 152, 153 are replaced by p-regions 164, 165, 166, respectively. The p-regions 164, 165 constitute an LDD in conjunction with the p$^+$-regions 162, 163. The p-regions 164, 165 are provided as needed, and can be omitted.

The n-well region 161 includes a channel part 161c extending between the p$^+$-region 162 and the p$^+$-region 163. The gate electrode 145 is provided on the channel part 161c. The gate insulating film 146 is provided between the channel part 161c and the gate electrode 145.

In the semiconductor device 160, a p-channel MOS structure is formed from the p$^+$-region 162, the p$^+$-region 163, and the n-well region 161 (channel part 161c) between the p$^+$-region 162 and the p$^+$-region 163. That is, in this example, the semiconductor device 160 is a p-channel MOSFET.

For instance, a voltage is applied between the p$^+$-regions 162, 163, and a voltage is applied to the gate electrode 145. Thus, a current is passed between the source and the drain. In this state, the potential of the outer edge electrode 14 is set substantially equal to the potential of the gate electrode 145. Thus, in the semiconductor device 160, a channel CH is formed in the surface of the n-well region 161 below the outer edge electrode 14. Here, the p-region 166 may be omitted. Thus, as in the above embodiments, the leakage current is suppressed also in the semiconductor device 160 of the p-channel MOSFET. As described above, the semiconductor device 160 may be a p-channel MOSFET. Also in the semiconductor device 160, no electrode in ohmic contact with the semiconductor layer 12 exists in the portion outside the outer edge electrode 14.

Fourth Embodiment

Figure 10:
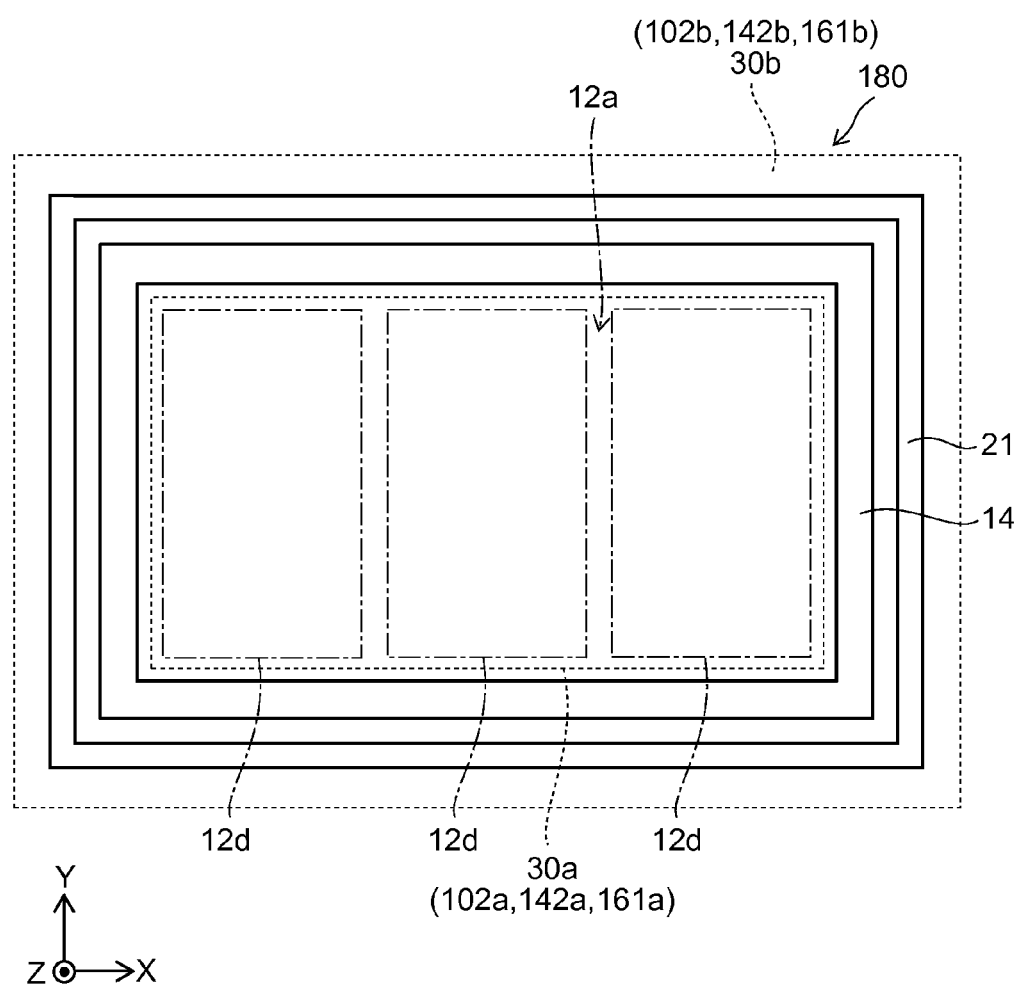
FIG. 10 is a schematic plan view showing part of a semiconductor device according to a fourth embodiment.

FIG. 10 is a schematic plan view showing part of a semiconductor device according to a fourth embodiment.

As shown in FIG. 10, in the semiconductor device 180, a plurality of device sections 12d are provided in the semiconductor layer 12. The device section 12d is a portion functioning as one device in the semiconductor device. For instance, in the semiconductor devices 10, 60, 70, 80, the device section 12d is a portion inside the second cathode region 32. In the semiconductor devices 100, 120, 130, the device section 12d is a portion inside the outermost drain region 106s. In the semiconductor devices 140, 160, the device section 12d is a portion between the source and the drain. In the semiconductor device 180, a plurality of device sections 12d are provided in the island section 12a. The plurality of device sections 12d are provided in the first portion (e.g., the first portion 30a, 102a, 142a, 161a of the above embodiments) of the first region.

This example shows three device sections 12d arranged in the X-axis direction. The number of device sections 12d provided in the semiconductor layer 12 is not limited to three, but may be two, or four or more. The arrangement of the plurality of device sections 12d is not limited to the foregoing, but may be arbitrary. For instance, the plurality of device sections 12d may be arranged in a two-dimensional matrix.

Each of the plurality of device sections 12d provided in the island section 12a may be a diode, LDMOS, or MOSFET. The plurality of device sections 12d provided in the island section 12a may be devices of only the same kind, or may be devices of different kinds.

The outer edge electrode 14 is formed in a ring shape along the outer edge of the first portion in which the plurality of device sections 12d are provided. The outer edge electrode 14 does not necessarily need to have a ring shape.

Thus, a plurality of device sections 12d may be provided in the semiconductor layer 12. In the case of providing a plurality of device sections 12d, for instance, a plurality of outer edge electrodes 14 may be provided. Each of the plurality of device sections 12d may be surrounded with the outer edge electrode 14.

The above embodiments show a diode, LDMOS, and MOSFET as a semiconductor device. The semiconductor device is not limited thereto, but may be e.g. a bipolar transistor, IGBT (insulated gate bipolar transistor), or thyristor. The semiconductor device is not limited thereto, but may be an arbitrary device.

The embodiments provide a semiconductor device in which the leakage current is suppressed.

The embodiments of the invention have been described above with reference to examples. However, the embodiments of the invention are not limited to these examples. For instance, any specific configurations of various components such as the semiconductor layer, first electrode, first insulating film, first region, second region, third region, fourth region, fifth region, first portion, second portion, second electrode, second insulating film, first intermediate region, second intermediate region, insulating part, control electrode, control insulating film, buried layer, and insulating part included in the semiconductor device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Those skilled in the art can appropriately modify and practice the semiconductor device described above as the embodiments of the invention. All such semiconductor devices are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor substrate;
   a semiconductor layer provided on the semiconductor substrate, the semiconductor layer including:
      a first region including a first portion and a second portion, the second portion being arranged with the first portion in a first direction perpendicular to a stacking direction of the semiconductor substrate and the semiconductor layer;
      a second region provided in a surface of the first portion, the second region having a first conductivity type;
      a third region provided between the second portion and the second region in the surface of the first portion, the third region being apart from the second portion and the second region, the third region having a second conductivity type different from the first conductivity type;
      a fourth region provided between the second portion and the third region in the surface of the first portion, the fourth region being adjacent to the second portion, the fourth region having the first conductivity type; and
      a fifth region provided in a surface of the fourth region, the fifth region having the second conductivity type;
   a first electrode provided between the fifth region and the second portion on the semiconductor layer; and
   a first insulating film provided between the semiconductor layer and the first electrode.

2. The device according to claim 1, further comprising:
   an insulating part provided in a surface of the second portion,
   the first electrode being provided astride between the fifth region and the insulating part.

3. The device according to claim 1, wherein the third region, the fourth region, the first insulating film, and the first electrode are each formed so as to surround the second region.

4. The device according to claim 1, further comprising:
   a second insulating film and a second electrode,
   the semiconductor layer further including:
      a first impurity region provided in a surface of the second portion, the first impurity region having the first conductivity type; and
      a second impurity region provided in a surface of the first impurity region, the second impurity region having the second conductivity type,
   the first electrode being provided between the fifth region and the second impurity region,
   the second electrode having one end placed on the first impurity region, the second electrode being arranged in the first direction with the first electrode on the semiconductor layer, and
   the second insulating film being provided between the semiconductor layer and the second electrode.

5. The device according to claim 1, wherein the first electrode is electrically floating.

6. The device according to claim 1, wherein the first electrode is electrically connected to the second region and the fourth region.

7. The device according to claim 1, further comprising:
   a buried layer and an insulating part,
   the buried layer being provided between the semiconductor substrate and the semiconductor layer,
   the insulating part being provided on the buried layer, the insulating part being along an outer edge of the buried layer,
   a conductivity type of the buried layer and a conductivity type of the insulating part being different from a conductivity type of the first region, and
   the first region being provided on the buried layer, the first region being arranged with the insulating part in the first direction.

8. The device according to claim 7, wherein the insulating part is formed so as to surround the first region.

9. The device according to claim 1, wherein no electrode in ohmic contact with the semiconductor layer exists on the second portion.

10. A semiconductor device comprising:
    a semiconductor substrate;
    a semiconductor layer provided on the semiconductor substrate, the semiconductor layer including:
       a first region including a first portion and a second portion, the second portion being arranged with the first portion in a first direction perpendicular to a stacking direction of the semiconductor substrate and the semiconductor layer;
       a second region provided in a surface of the first portion, the second region having a first conductivity type;
       a third region provided between the second portion and the second region in the surface of the first portion, the third region being adjacent to the second portion, the third region having a second conductivity type different from the first conductivity type;
       a source region provided in a surface of the second region, the source region having the second conductivity type;

a drain region provided in a surface of the third region, the drain region having the second conductivity type; and an insulating part provided between the source region and the drain region in the surface of the third region, the insulating part being adjacent to the drain region;

a control electrode formed astride between the source region and the insulating part on the semiconductor layer;

a control insulating film provided between the control electrode and the semiconductor layer;

a first electrode provided between the drain region and the second portion on the semiconductor layer; and a first insulating film provided between the semiconductor layer and the first electrode.

11. The device according to claim 10, wherein the first electrode is electrically floating.

12. The device according to claim 10, wherein the second portion and the first electrode are each formed so as to surround the first portion.

13. The device according to claim 10, wherein the first electrode is electrically connected to the control electrode.

14. The device according to claim 10, further comprising: a buried layer and an insulating part, the buried layer being provided between the semiconductor substrate and the semiconductor layer, the insulating part being provided on the buried layer, the insulating part being along an outer edge of the buried layer, a conductivity type of the buried layer and a conductivity type of the insulating part being different from a conductivity type of the first region, and the first region being provided on the buried layer, the first region being arranged with the insulating part in the first direction.

15. The device according to claim 14, wherein the insulating part is formed so as to surround the first region.

16. The device according to claim 10, wherein no electrode in ohmic contact with the semiconductor layer exists on the second portion.

17. A semiconductor device comprising:

a semiconductor substrate;

a first region provided on the semiconductor substrate, the first region including a first portion and a second portion, the second portion being arranged with the first portion in a first direction perpendicular to a stacking direction of the semiconductor substrate and the first region, the first region having a first conductivity type;

a second region provided in a surface of the first portion, the second region having a second conductivity type different from the first conductivity type;

a third region provided between the second portion and the second region in the surface of the first portion, the third region being apart from the second region, the third region being adjacent to the second portion, the third region having the second conductivity type;

a control insulating film provided on the first portion, the control insulating film being placed between the second region and the third region;

a control electrode provided on the control insulating film;

a first insulating film provided on the second portion, the first insulating film being adjacent to the third region; and a first electrode provided on the first insulating film.

18. The device according to claim 17, wherein the first electrode is electrically connected to the control electrode.

19. The device according to claim 17, wherein the first electrode is electrically floating.

20. The device according to claim 17, wherein no electrode in ohmic contact with the semiconductor layer exists on the second portion.

* * * * *